United States Patent [19]
Yanagisawa et al.

[11] Patent Number: 5,353,257
[45] Date of Patent: Oct. 4, 1994

[54] WORD LINE DRIVING CIRCUIT AND SEMICONDUCTOR MEMORY DEVICE USING THE SAME

[75] Inventors: Makoto Yanagisawa; Yukinori Kodama, both of Kawasaki, Japan

[73] Assignee: Fujitsu Limited, Japan

[21] Appl. No.: 16,613

[22] Filed: Feb. 11, 1993

[30] Foreign Application Priority Data

Feb. 17, 1992 [JP] Japan ................................ 4-029699

[51] Int. Cl.$^5$ ................................................. G11C 8/00
[52] U.S. Cl. .............................. 365/230.06; 365/189.11
[58] Field of Search ............... 365/230.06, 233, 189.11

[56] References Cited
FOREIGN PATENT DOCUMENTS

1-94591  4/1989  Japan ................. 365/230.06

*Primary Examiner*—Joseph A. Popek
*Attorney, Agent, or Firm*—Greer, Burns & Crain, Ltd.

[57] ABSTRACT

In a word line driving circuit coupled to a word line of a memory cell array of a semiconductor memory device, a first transistor has a first terminal receiving an input signal based on a row address signal applied to the semiconductor memory device, a second terminal, and a control terminal receiving a first timing signal. A second transistor having a first terminal receiving a second timing signal, a second terminal connected to the word line, and a control terminal connected to the second terminal of the first transistor. A third transistor has a first terminal connected to the second terminal of the second transistor, a second terminal set at a predetermined potential, and a control terminal receiving a third timing signal. The first transistor has a threshold voltage less than that of at least one of the second and third transistors.

17 Claims, 8 Drawing Sheets

WORD LINE DRIVING CIRCUIT AND SEMICONDUCTOR MEMORY DEVICE USING THE SAME

BACKGROUND OF THE INVENTION

1. Field of the Invention

The present invention generally relates to semiconductor memory devices, and more particularly to a word line driving circuit of a dynamic random access memory device.

2. Description of the Prior Art

Recently, there has been considerable activity in the development of dynamic random access memory devices operable with a low power supply voltage in order to reduce power consumption. As the power supply voltage decreases, it becomes difficult to effectively boost word lines. Hence, it is required to obtain a high enough voltage to drive the word lines.

Figure 1:
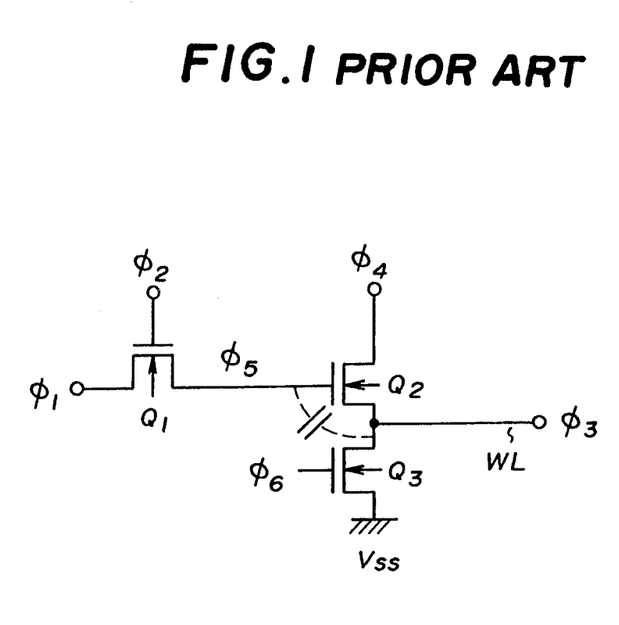
FIG. 1 is a circuit diagram of a conventional word line driving circuit.

FIG. 1 is a circuit diagram of a conventional row decoder of a dynamic random access memory device. A plurality of row decoders respectively having the same circuit configuration as shown in FIG. 1 are provided for the respective word lines. A timing signal $\phi 1$ switches to a high level (equal to a bias voltage Vcc) in response to input of address data, and is applied to the drain of an n-channel field effect transistor Q1, such as a MOS transistor. A timing signal $\phi 2$ is applied to the gate of the transistor Q1. The timing signal $\phi 2$ switches from a low level (equal to the ground potential 0 V=Vss) to the high level (equal to the bias voltage Vcc) after a predetermined delay time from the fall of the level of a row address strobe (/RAS) signal. Normally, the row address strobe signal switches to the low level when it is turned ON. The symbol "/" indicates the active-low signal.

A signal $\phi 5$ obtained at the source of the transistor Q1 is applied to the gate of an n-channel field effect transistor Q2, such as a MOS transistor. The drain of the transistor Q2 is connected to a boost timing signal line via which a boost timing signal $\phi 4$ is applied to the drain of the transistor Q2. The source of the transistor Q2 is connected to a word line WL and the drain of an n-channel field effect transistor Q3, such as a MOS transistor. The source of the transistor Q2 is grounded and set at the ground potential Vss. A timing signal $\phi 6$, which is the inverted version of the timing signal $\phi 1$, is applied to the gate of the transistor Q3. An output signal $\phi 3$ transferred via the word line WL is controlled by the transistors Q2 and Q3. A capacitor shown in FIG. 1 is a parasitic capacitor.

The word line WL is driven in the following manner. The timing signal $\phi 2$ switches from the ground potential Vss to the bias potential Vcc after a predetermined delay time from the fall of the level of the row address strobe signal. Then, the timing signal $\phi 1$ switches from the ground potential Vss to the bias potential Vcc, and simultaneously the timing signal $\phi 6$ switches from the bias potential Vcc to the ground potential Vss.

In response to the above changes in the timing signals $\phi 1$ and $\phi 6$, the output signal $\phi 5$ of the transistor Q1 rises from the ground potential Vss to a potential (Vcc - Vth) where Vcc is the high level of the timing signal $\phi 1$ and Vth is the threshold voltage of the transistor Q1. In response to rising of the level of the output signal $\phi 5$, the transistor Q2 is turned ON. Since transistor Q3 is controlled by the inverted version $\phi 6$ of the timing signal $\phi 1$, the transistor Q3 is turned OFF when the timing signal $\phi 1$ switches to the high level. Hence, the output signal $\phi 3$ for driving the word line WL rises as the timing signal $\phi 4$ rises. During the above operation, the parasitic capacitor provides a so-called self-boosting function.

Conventionally, the transistors Q1, Q2 and Q3 are simultaneously produced by an identical ion implantation process. Hence, the impurity concentrations of the transistors Q1, Q2 and Q3 are the same as each other, and hence the threshold voltages of the transistors Q1, Q2 and Q3 are the same as each other.

Figure 2:
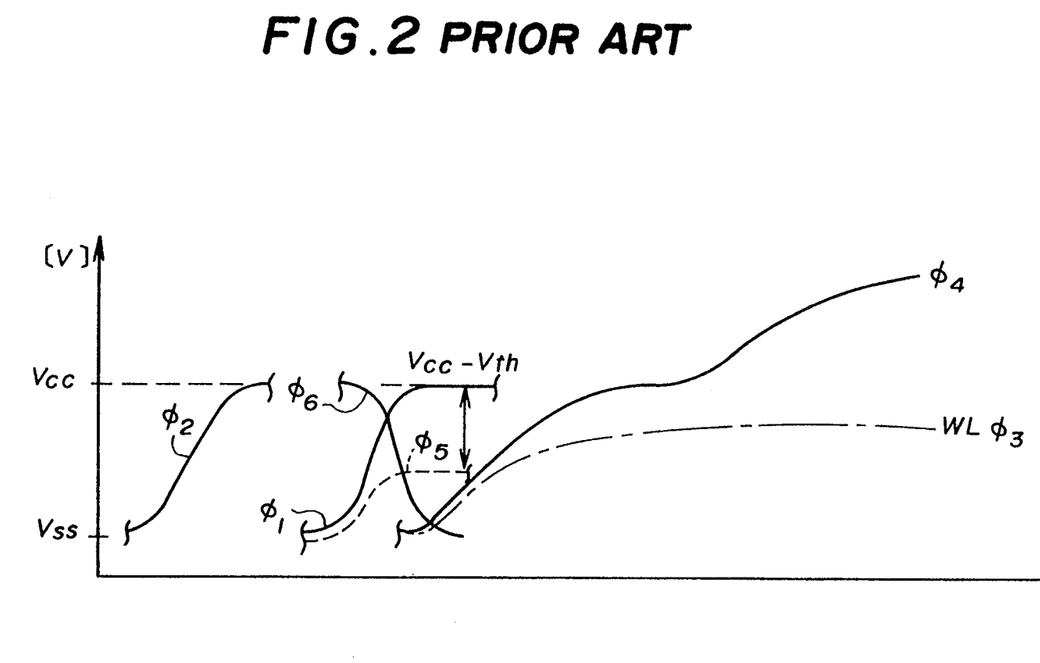
FIG. 2 is a waveform diagram illustrating the operation of the word line driving circuit.

If the bias potential Vcc is set at a potential lower than the potential shown in FIG. 2, the following problems will occur. As the bias voltage Vcc decreases, the timing signal $\phi 2$ applied to the gate of the transistor Q1 decreases, and hence the gate voltage of the transistor Q1 also decreases. As a result; the level of the signal $\phi 5$ decreases and the gate voltage of the transistor Q2 also decreases. Hence, the transistor Q2 cannot be fully turned ON, and the word line driving signal $\phi 3$ does not have a high enough voltage to drive the word line WL.

In order to eliminate the above problem, it may be possible to reduce the threshold voltage of the transistor Q2 and turn the transistor Q2 ON at a decreased threshold voltage. However, in this case, a leakage current will increase and a large leakage current pass will pass through the transistor Q2 and a large quantity of power will be consumed even when the transistor is OFF.

It may also be possible to increase the potential of the timing signal $\phi 2$ to become equal to a potential higher than the bias potential Vcc. In this case, the ON state of the transistor Q1 will be facilitated. However, this needs an additional power supply source for providing a potential higher than the bias potential Vcc.

SUMMARY OF THE INVENTION

It is a general object of the present invention to provide a word line driving circuit in which the above disadvantages are eliminated.

A more specific object of the present invention is to provide a word line driving circuit capable of generating a word line driving signal having a high enough potential to drive a word line even when a decreased bias voltage is used.

The above objects of the present invention are achieved by a word line driving circuit coupled to a word line of a memory cell array of a semiconductor memory device, the word line driving circuit comprising: a first transistor having a first terminal receiving an input signal based on a row address signal applied to the semiconductor memory device, a second terminal, and a control terminal receiving a first timing signal having a fixed bias potential; a second transistor having a first terminal receiving a second timing signal, a second terminal connected to the word line, and a control terminal connected to the second terminal of the first transistor; and a third transistor having a first terminal connected to the second terminal of the second transistor, a second terminal set at a predetermined potential, and a control terminal receiving a third timing signal, the first transistor having a threshold voltage less than that of at least one of the second and third transistors.

Another object of the present invention is to provide a semiconductor memory device having the above-mentioned word line driving circuit.

This object of the present invention is achieved by a semiconductor memory device comprising: a memory cell array connected to word lines and bit lines; a row address decoder selecting one of the word lines in response to a row address signal; a column address decoder selecting one of the bit lines in response to a column address signal; and data input/output means, coupled to the memory cell array, for writing data into the memory cell array and reading data from the memory cell array. The row address decoder comprises word line driving circuits respectively provided for the word lines. Each of the word line driving circuits comprises: a first transistor having a first terminal receiving an input signal based on the row address signal, a second terminal, and a control terminal receiving a first timing signal having a fixed bias potential; a second transistor having a first terminal receiving a second timing signal, a second terminal connected to the word line, and a control terminal connected to the second terminal of the first transistor; and a third transistor having a first terminal connected to the second terminal of the second transistor, a second terminal set at a predetermined potential, and a control terminal receiving a third timing signal. The first transistor has a threshold voltage less than that of at least one of the second and third transistors.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
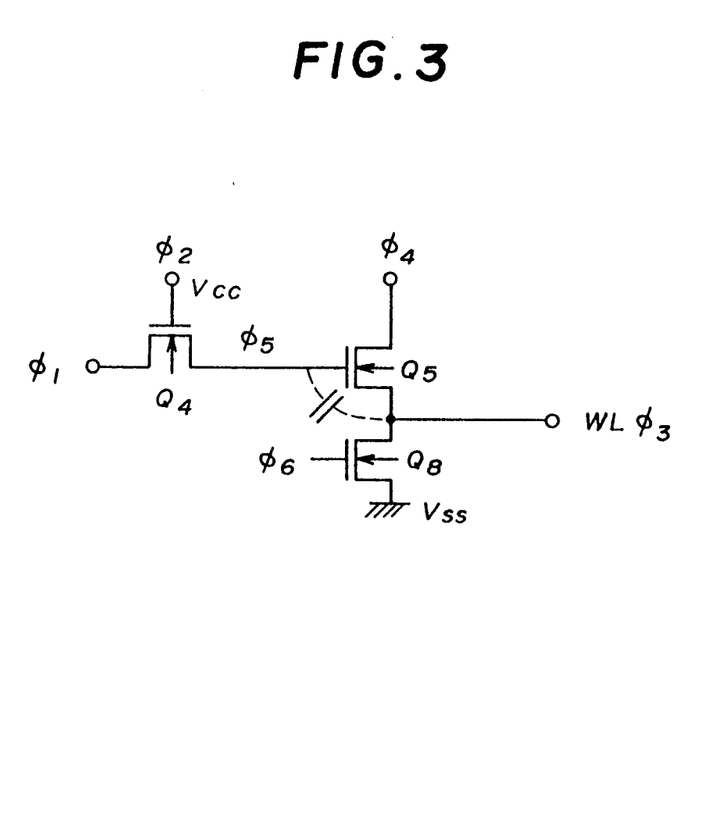
FIG. 3 is a circuit diagram of a word line driving circuit according to an embodiment of the present invention.

FIG. 3 is a circuit diagram of a word line driving circuit according to an embodiment of the present invention. The word line driving circuit shown in FIG. 3 is made up of n-channel field effect transistors Q4, Q5 and Q6, such as MOS transistors. The timing signal $\phi 1$ is applied to the drain of the transistor Q4, and the timing signal $\phi 2$ is applied to the gate of the transistor Q4. The signal obtained at the source of the transistor Q4 is applied to the gate of the transistor Q5. The timing signal $\phi 4$ is applied to the drain of the transistor Q5, and the source thereof is connected to the word line WL. The drain of the transistor Q6 is connected to the source of the transistor Q5, and the source of the transistor Q6 is grounded. The inverted version $\phi 6$ of the timing signal $\phi 1$ is applied to the gate of the transistor Q6.

According to the present invention, the threshold voltage of the transistor Q4 is selected so that the threshold voltage of the transistor Q4 is less than that of the transistor Q5. Hence, the transistor Q4 can be sufficiently turned ON even when the bias voltage Vcc has a decreased level. Hence, it becomes possible to prevent the level of the timing signal $\phi 1$ from being decreased at the transistor Q4 and to fully turn the transistor Q5 ON. As a result, the word line driving signal $\phi 3$ has a high enough potential to sufficiently drive the word line WL. The threshold voltage of the transistor Q4 can be adjusted by controlling the dose of an impurity with respect to the transistor Q4, as will be described later.

Figure 4:
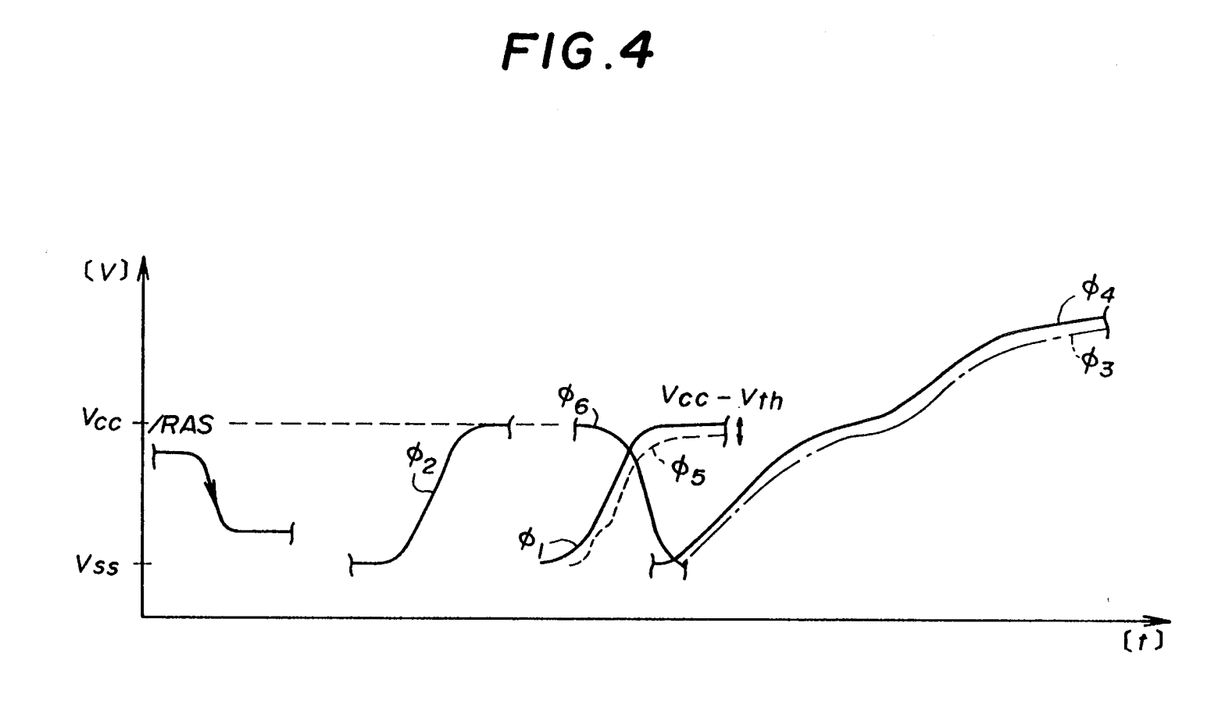
FIG. 4 is a waveform diagram illustrating the operation of the word line driving circuit shown in FIG. 3.

The word line driving circuit shown in FIG. 3 operates as shown in FIG. 4. The row address strobe (/RAS) signal switches from a high level to a low level. After a predetermined delay time from the above switching of the row address strobe signal, the timing signal $\phi 2$ switches from the low level to the high level. The timing signal $\phi 2$ may be maintained at the potential Vcc. When the word line shown in FIG. 3 is selected, the timing signal $\phi 1$ switches to the high level equal to the potential Vcc, and the output signal $\phi 5$ of the transistor Q4 is charged up to a potential equal to (Vcc - Vth) where Vth is the threshold voltage of the transistor Q4.

The timing signal $\phi 6$ rises as the timing signal $\phi 1$ falls, and the transistor Q6 is turned OFF. After the transistor Q6 is completely turned OFF, the boost timing signal $\phi 4$ applied to the drain of the transistor Q5 starts to increase. Then, the word line driving signal $\phi 3$ starts to rise and finally reaches a potential approximately equal to the potential of the boost timing signal $\phi 4$. This operation is facilitated due to the self-boosting function related to the parasitic capacitor coupled between the gate and the source of the transistor Q5.

The transistors Q4, Q5 and Q6 are formed in a substrate in which memory cells and other elements are also formed.

Figure 5:
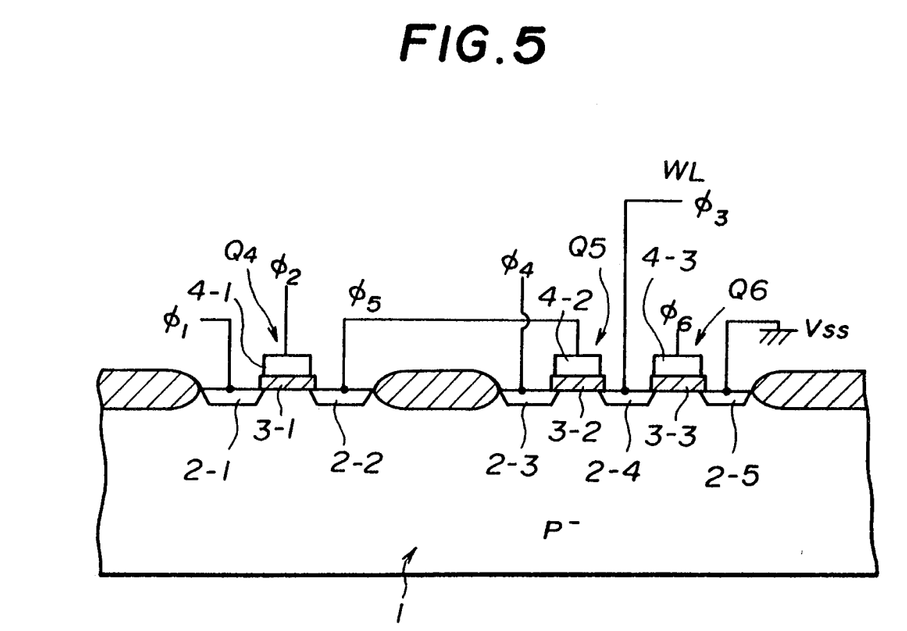
FIG. 5 is a cross-sectional view of the word line driving circuit shown in FIG. 3.

Referring to FIG. 5, a semiconductor substrate 1 is made of a p-type semiconductor material. As shown in FIG. 5, n-type impurity-diffused regions 2-1-2-5 are formed in a surface portion of the semiconductor substrate 1. The impurity-diffused region 2-1 functions as the drain of the transistor Q4, and the impurity-diffused region 2-2 functions as the source of the transistor Q4. An insulating film 3-1 is formed on the surface of the semiconductor substrate 1 and is located between the impurity-diffused regions 2-1 and 2-2. A conductive layer 4-1, such as a metallic layer, is formed on the insulating film 3-1. The conductive film 4-1 functions as the gate electrode of the transistor Q4.

The impurity-diffused region 2-3 functions as the drain of the transistor Q5. The boost timing signal line via which the boost timing signal $\phi 4$ is transferred is connected to the impurity-diffused region 2-3. The impurity-diffused region 2-4 functions as the source of the transistor Q5 as well as the drain of the transistor Q6. The word line WL is connected to the impurity-diffused region 2-4. An insulating film 3-2 is formed on the surface of the semiconductor substrate 1 and is located between the impurity-diffused regions 2-3 and 2-4. A conductive layer 4-2, such as a metallic layer, is formed on the insulating film 3-2. The conductive layer 4-2 functions as the gate electrode of the transistor Q5.

The impurity-diffused region 2-5 functions as the source of the transistor Q6, and is grounded. An insulating film is formed on the substrate 1 and is located between the impurity-diffused regions 2-4 and 2-5. A conductive layer 4-3, such as a metallic layer, is formed on the insulating later 3-3. The conductive layer 4-3 functions as the gate electrode of the transistor Q6.

Generally, in the n-channel MOS transistor the threshold voltage is based on the dose (concentration) of boron ions diffused into the substrate. More particularly, the threshold voltage increases as the dose of boron ions increases. With the above in mind, the dose of boron ions diffused into the regions 2-1 and 2-2 of the transistor Q4 is selected so that it is slightly less than the dose of boron ions diffused into the regions 2-3-2-5 of the transistors Q5 and Q6. For example, a dose of $1 \times 10^{12}$ boron ions/cm$^2$ is diffused into the regions 2-1 and 2-2, and a dose of $3 \times 10^{12}$ boron ions/cm$^2$ is diffused into the regions 2-3-2-5. In this manner, the threshold voltage of the transistor Q4 is less than the threshold voltages of the transistors Q5 and Q6.

Figure 6:
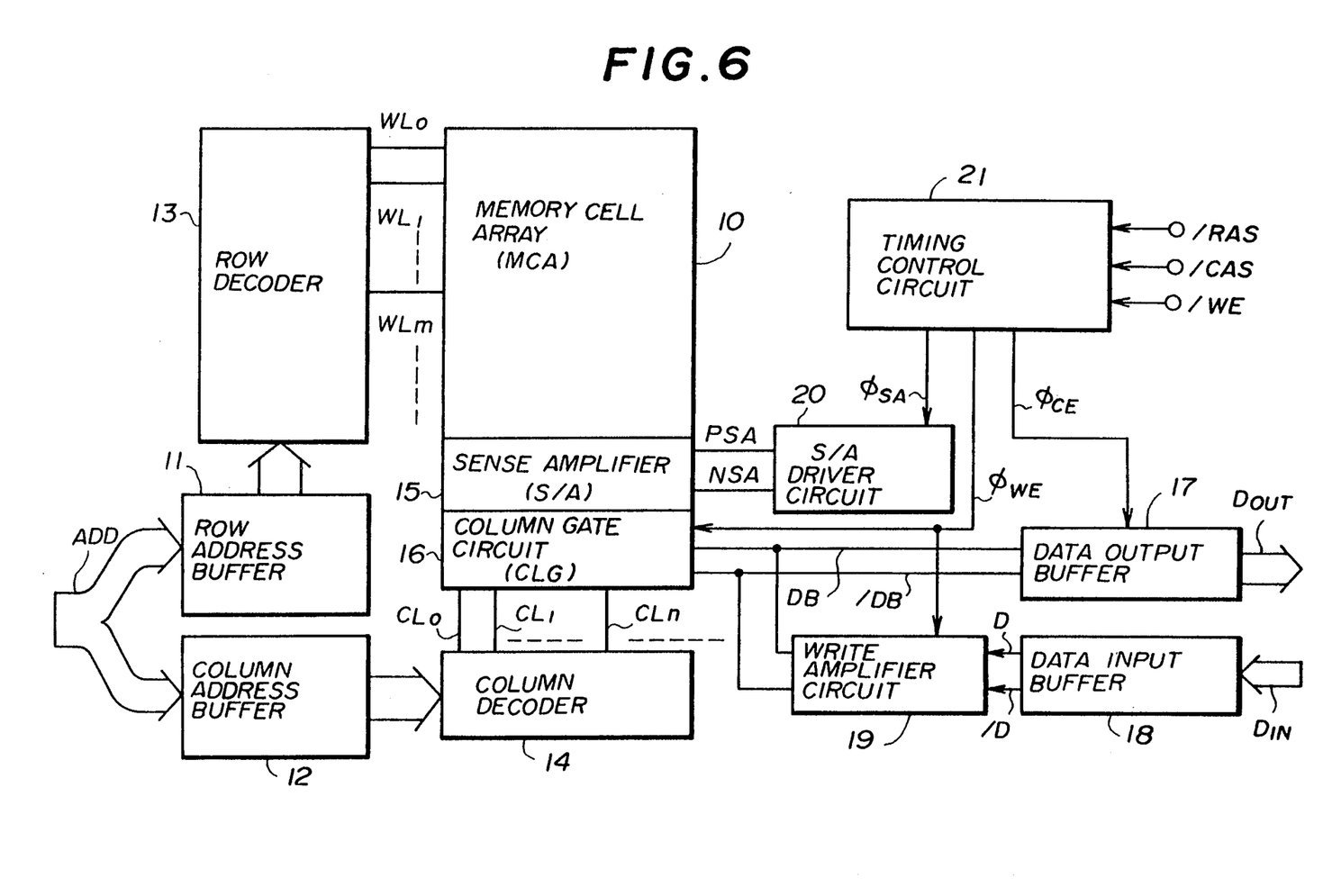
FIG. 6 is a block diagram of a dynamic random access memory device to which the present invention is applied.

FIG. 6 is a block diagram of a dynamic random access memory (DRAM) device to which the present invention is applied. The DRAM device shown in FIG. 6 includes a memory cell array (MCA) 10 having memory cells arranged in rows and columns. An address signal ADD is applied to a row address buffer 11 and a column address buffer 12. The row address buffer 11 stores a row address of the address signal ADD, and the column address buffer 12 stores a column address of the address signal ADD. The row address in the row address buffer 11 is applied to a row decoder 13, which selects one of word lines WL0, WL1, . . . , WLm, . . . connected to the memory cell array 10 in accordance with the row address signal. The column address in the column address buffer 12 is applied to a column decoder 14, which selects one of column lines CL0, CL1, . . . , CLn, . . . connected to bit lines extending from the memory cell array 10.

A timing control circuit 21 receives the row address strobe signal /RAS, a column address strobe signal /CAS, and a write enable signal /WE, and generates timing signals $\phi_{SA}$, $\phi_{WE}$, and $\phi_{CE}$. A sense amplifier driver circuit 20 activates a sense amplifier circuit via control lines PSA and NSA in response to the timing signal $\phi_{SA}$. A column gate circuit (CLG) 16 is activated in response to the timing signal $\phi_{WE}$. Data read via a pair of bit lines specified by the column decoder 14 is sensed by the sense amplifier circuit 15 and is output to a data output buffer 17 via the column gate circuit 16 and a pair of data buses DB and /DB. The data output buffer 17 is activated in response to the timing signal $\phi_{CE}$. The data stored in the data output buffer 17 is output to an external device as read data Dout.

Write data Din is stored in a data input buffer 18, and applied to a write amplifier circuit 19 via a pair of data input lines D and /D. The write amplifier circuit 19 is activated in response to the timing signal $\phi_{WE}$. The write data Din is then written into the memory cell via the column gate circuit 16 and the sense amplifier 15.

Figure 7:
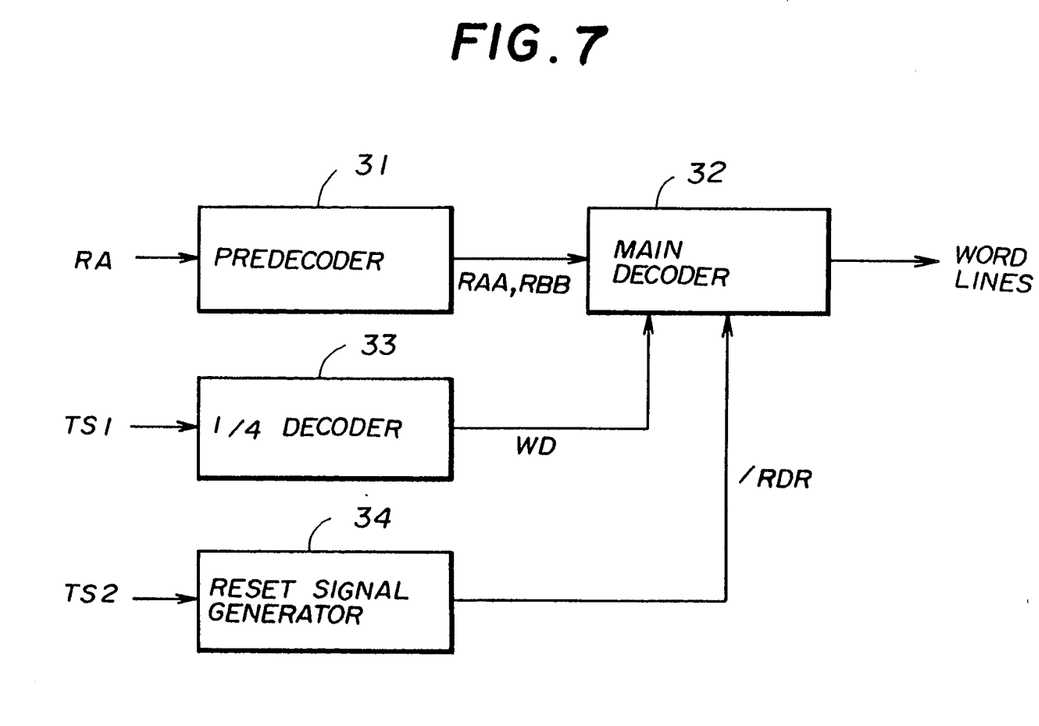
FIG. 7 is a block diagram of a row address decoder shown in FIG. 6.

FIG. 7 is a block diagram of the row decoder 13 shown in FIG. 6. The row decoder 13 shown in FIG. 7 includes a predecoder 31, a main decoder 32, a ¼ decoder 33 and a reset signal generator 34. The predecoder 31 generates complementary internal (predecoded) row address bits RAA and RAB from a row address bit RA. When the row address signal consists of n bits, n pairs of complementary predecoded row address bits RAA and RAB are generated by the predecoder 31. The ¼ decoder 33 receives a timing signal TS1 from the timing control circuit 21 (FIG. 6), and generates a boost timing signal WD corresponding to the aforementioned boost timing signal $\phi$4. The level change of the timing signal TS1 is based on the level change of the row address strobe signal /RAS. The boost timing signal WD is applied to the main decoder 32. The reset signal generator 34 receives a timing signal TS2 from the timing control circuit 21, and generates a reset signal /RDR applied to the main decoder 32. The level change of the timing signal TS2 is based on the level change of the row address strobe signal /RAS. In the decoding operation, the reset signal is turned ON before the predecoded signals RAA and RBB are applied to the main decoder 32.

Figure 8:
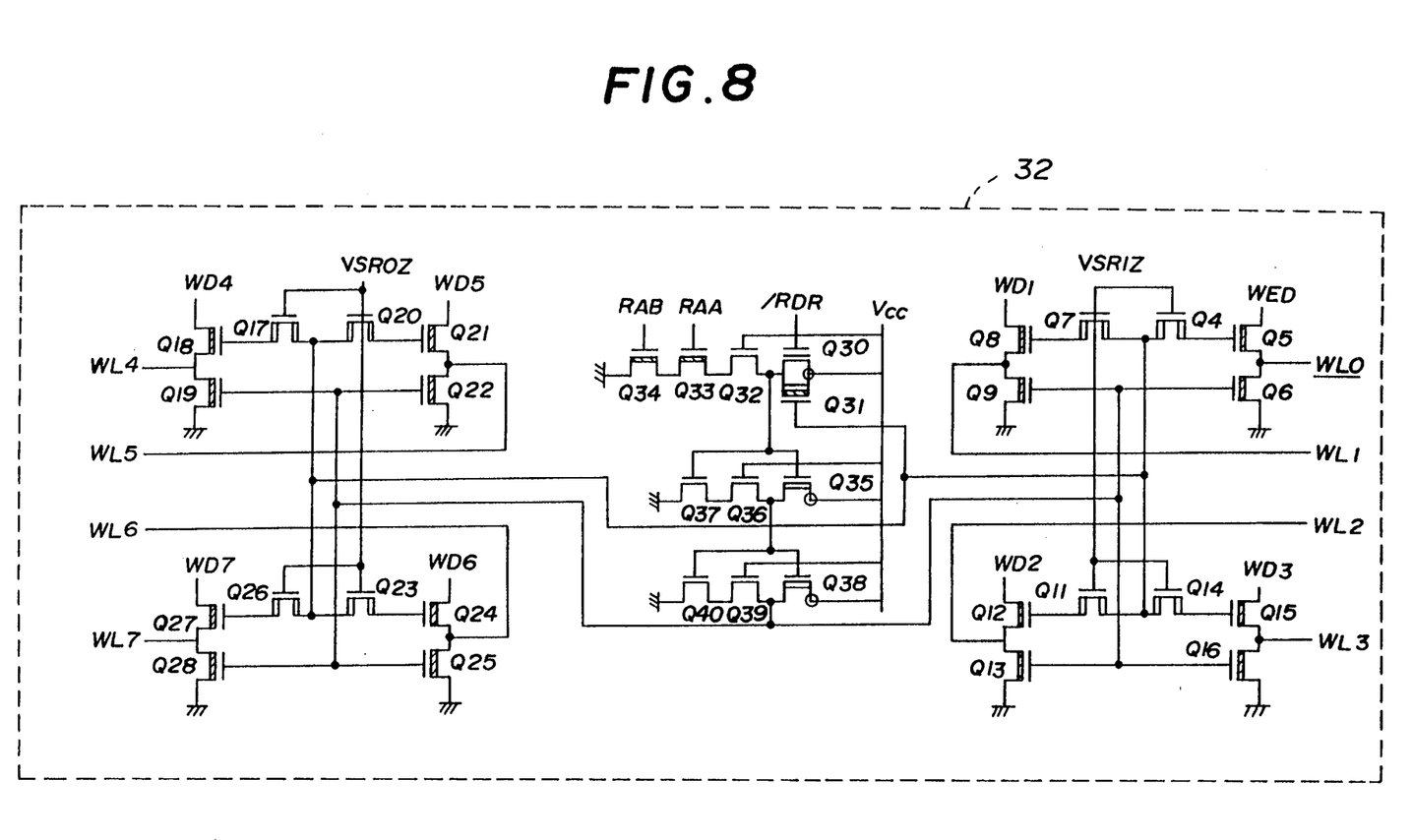
FIG. 8 is a circuit diagram of a main decoder shown in FIG. 7.

FIG. 8 is a circuit diagram of the main decoder 32 shown in FIG. 7. The main decoder 32 shown in FIG. 8 drives eight word lines WL0-WL7. The aforementioned transistors Q4-Q6 form a word line driving circuit for driving the word line WL0. Similarly, transistors Q7-Q9 form a word line driving circuit for driving the word line WD1. Transistors Q11-Q13 form a word line driving circuit for driving the word line WD2. Transistors Q14-Q16 form a word line driving circuit for driving the word line WL3. Transistors Q17-Q19 form a word line driving circuit for driving the word line WL4. Transistors Q20-Q22 form a word line driving circuit for driving the word line WL5. Transistors Q23-Q25 form a word line driving circuit for driving the word line WL6. Transistors Q26-Q28 form a word line driving circuit for driving the word line WL7. The above transistors are configured in the same manner as the transistors Q4-Q6 shown in FIG. 3. For example, the threshold voltage of the transistor Q26 is less than the threshold voltages of the transistors Q27 and Q28. The transistors Q4, Q7, Q11, Q14, Q17, Q20, Q23 and Q26 have identical threshold levels less than those of the other transistors.

A voltage signal VSR0Z, which corresponds to the aforementioned timing signal $\phi$2, is applied to the gates of the transistors Q17, Q20, Q23 and Q26. The voltage signal VSR0Z has the same potential, when high, as the bias voltage Vcc. A voltage signal VSR1Z, which also corresponds to the aforementioned timing signal $\phi$2, is applied to the gates of the transistors Q4, Q7, Q11 and Q14. The voltage signal VSR1Z has the same potential, when high, as the bias voltage Vcc.

Signals corresponding to the aforementioned clock signal $\phi$1 are generated by a circuit made up of transistors Q30-Q40 shown in FIG. 8. The transistors Q31, Q35 and Q38 are p-channel field effect transistors. The reset signal /RDR is turned ON (switched to the low level), before the predecoded bits RAA and RAB are generated from the predecoder 31. Thereby, the transistor Q30 is turned ON, and the gates of the transistors Q35 and Q37 are charged up to the potential Vcc. At this time, the transistor Q35 is turned ON, and hence the transistors Q38 and Q40 are also charged up to the potential Vcc. Hence, the transistor Q38 is turned ON. As a result, the potential Vcc is applied to the gates of the transistors Q6, Q9, Q13, Q16, Q19, Q22, Q25 and Q28, and the word lines WL0-WL 7 are reset to the ground potential.

Thereafter, the predecoded row address bits RAA and RAB are applied to the gates of the transistors Q33 and Q34, respectively. The main decoder 32 shown in FIG. 8 is activated by the predecoded row address bits RAA and RAB. However, the other main decoders will be activated by other combinations of the predecoded row address bits. According to the predecoded bits RAA and RAB, the transistors Q35 and Q38 are turned OFF. The ¼ decoder 33 sequentially groups of WD0 and WD4, WD1 and WD5, WD2 and WD6, and WD3 and WD7.

The present invention is not limited to the specifically disclosed embodiments, and variations and modifications may be made without departing from the scope of the present invention.

What is claimed is:

1. A word line driving circuit coupled to a word line of a memory cell array of a semiconductor memory device, said word line driving circuit comprising:
   a first transistor having a first terminal receiving an input signal based on a row address signal applied to the semiconductor memory device; a second terminal, and a control terminal receiving a first timing signal;
   a second transistor having a first terminal receiving a second timing signal, a second terminal connected to the word line, and a control terminal connected to the second terminal of the first transistor; and
   a third transistor having a first terminal connected to the second terminal of the second transistor, a second terminal set at a predetermined potential, and a control terminal receiving a third timing signal,
   the first transistor having a threshold voltage less than that of the third transistor.

2. The word line driving circuit as claimed in claim 1, wherein the first transistor has an impurity concentration less than that of said at least one of the second and third transistors.

3. The word line driving circuit as claimed in claim 1, wherein the first timing signal is fixed at a power supply voltage applied to the semiconductor memory device.

4. The word line driving circuit as claimed in claim 1, wherein the threshold voltage of the first transistor is less than that of the second transistor.

5. The word line driving circuit as claimed in claim 1, wherein the threshold voltage of the first transistor is less than threshold voltages of the second and third transistors.

6. The word line driving circuit as claimed in claim 1, wherein the third timing signal is an inverted version of the input signal.

7. The word line driving circuit as claimed in claim 1, wherein the second timing signal is at a potential at which the first timing signal is, when both the first and second timing signals are high.

8. The word line driving circuit as claimed in claim 1, wherein the first, second and third transistors are n-channel field effect transistors.

9. A semiconductor memory device comprising:
   a memory cell array connected to word lines and bit lines;
   a row address decoder selecting one of the word lines in response to a row address signal;
   a column address decoder selecting one of the bit lines in response to a column address signal; and
   data input/output means, coupled to the memory cell array, for writing data into the memory cell array and reading data from the memory cell array,
   said row address decoder comprising word line driving circuits respectively provided for the word lines,
   each of the word line driving circuits comprising:
   a first transistor having a first terminal receiving an input signal based on the row address signal, a second terminal, and a control terminal receiving a first timing signal;
   a second transistor having a first terminal receiving a second timing signal, a second terminal connected to the word line, and a control terminal connected to the second terminal of the first transistor; and
   a third transistor having a first terminal connected to the second terminal of the second transistor, a second terminal set at a predetermined potential, and a control terminal receiving a third timing signal,
   the first transistor having a threshold voltage less than that of the third transistor.

10. The semiconductor memory device as claimed in claim 9, wherein the first transistor has an impurity concentration less than that of said at least one of the second and third transistors.

11. The semiconductor memory device as claimed in claim 9, wherein the first timing signal is at a fixed potential equal to a power supply voltage applied to the semiconductor memory device.

12. The semiconductor memory device as claimed in claim 9, wherein the threshold voltage of the first transistor is less than that of the second transistor.

13. The semiconductor memory device as claimed in claim 9, wherein the threshold voltage of the first transistor is less than threshold voltages of the second and third transistors.

14. The semiconductor memory device as claimed in claim 9, wherein the third timing signal is an inverted version of the input signal.

15. The semiconductor memory device as claimed in claim 9, wherein the second timing signal is at a potential at which the first timing signal is, when both the first and second timing signals are high.

16. The semiconductor memory device as claimed in claim 9, wherein the first, second and third transistors are n-channel field effect transistors.

17. The semiconductor memory device as claimed in claim 9, wherein said semiconductor memory device is a dynamic random access memory device.

* * * * *